(12) United States Patent
Kang et al.

(10) Patent No.: US 11,322,216 B1
(45) Date of Patent: May 3, 2022

(54) FUSE ARRAY STRUCTURE

(71) Applicant: NANYA TECHNOLOGY CORPORATION, New Taipei (TW)

(72) Inventors: Ting-Cih Kang, New Taipei (TW); Chiang-Lin Shih, New Taipei (TW); Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/183,312

(22) Filed: Feb. 23, 2021

(51) Int. Cl.
*G11C 17/18* (2006.01)
*G11C 17/16* (2006.01)

(52) U.S. Cl.
CPC ............. *G11C 17/16* (2013.01); *G11C 17/18* (2013.01)

(58) Field of Classification Search
CPC .................................. G11C 17/16; G11C 17/18
USPC ..................................................... 365/225.7
See application file for complete search history.

(56) References Cited

U.S. PATENT DOCUMENTS

| | | | |
|---|---|---|---|
| 2012/0120733 A1* | 5/2012 | Son | G11C 17/18 365/189.02 |
| 2016/0379720 A1 | 12/2016 | Luan et al. | |

* cited by examiner

*Primary Examiner* — Huan Hoang
(74) *Attorney, Agent, or Firm* — CKC & Partners Co., LLC

(57) ABSTRACT

A fuse array structure includes first and second active areas, first and second line contacts, first and second gate contacts and a common gate layer formed across the first and second active areas. The first line contact and the first gate contact are formed on the first active area. The second line contact and the second gate contact are formed on the second active area. The common gate layer is between the first active area and the first gate contact and is between the second active area and the second gate contact. The first active area, the first line contact, the first gate contact and the common gate layer form a first fuse. The second active area, the second line contact, the second gate contact and the common gate layer form a second fuse.

13 Claims, 6 Drawing Sheets

FUSE ARRAY STRUCTURE

BACKGROUND

Field of Invention

The present disclosure relates to fuse array structures.

Description of Related Art

A fuse may be used for a read only memory. A fuse using MOSFET structures is widely used in the field of fuse design. The traditional gate oxide type of fuse including two or more MOSFETs are most commonly used. However, the fuse pattern occupies a significant area of a chip.

Therefore, those in the field are endeavoring to provide a solution for reducing an occupied area of a fuse on a chip.

SUMMARY

One aspect of the present disclosure is related to a fuse array structure.

According to one embodiment of the present disclosure, a fuse array structure includes first and second active areas, a common gate layer, a first line contact, a first gate contact, a second line contact and a second gate contact. The common gate layer is formed across the first and second active areas. The first line contact and the first gate contact are formed on the first active area. The common gate layer is between the first active area and the first gate contact. The first line contact is connected to a first common connecting line applied with a first voltage, and the first active area, the first line contact, the first gate contact and the common gate layer form a first fuse. The second line contact and the second gate contact are formed on the second active area. The second line contact is connected to a second common connecting line applied with a second voltage. The second line contact is connected to a second common connecting line applied with a second voltage. The second active area, the second line contact, the second gate contact and the common gate layer form a second fuse.

In one or more embodiments of the present disclosure, the common gate layer further includes a common conductive layer and an oxide layer. The common conductive layer is formed across the first and second active area. The oxide layer is formed under the common conductive layer.

In one or more embodiments of the present disclosure, each of the first and second active areas includes a semiconductor well with a first conductive type and a semiconductor doped region. The semiconductor doped region is formed within the semiconductor well and with a second conductive type different from the first conductive type.

In one or more embodiments of the present disclosure, each of the first and second active areas is surrounded by an isolation area.

In one or more embodiments of the present disclosure, the first and second active areas extend along a first direction and are arranged in parallel in a second direction perpendicular to the first direction. The common gate layer extends along the second direction.

In one or more embodiments of the present disclosure, the fuse array structure further includes a common connection structure. The common connection structure is connected to the first and second gate contacts and applied with a common potential.

In some embodiments, the common connection structure extends along a direction in which the common gate layer extends, so that all of the first and second gate contacts are covered by the common connection structure.

In one or more embodiments of the present disclosure, the fuse array structure further includes a first pair active area, a pair common gate layer, a first pair line contact, a first pair gate contact and a common connection structure. The pair common gate layer is formed on the first pair active area. The first pair line contact and the first pair gate contact are formed on the first pair active area. The pair common gate layer is between the first pair active area and the first pair gate contact. The first pair line contact is connected to the first common connecting line. The first pair active area, the first pair line contact, the first pair gate contact and the pair common gate layer form a first pair fuse. The common connection structure is connected to the first gate contact of the first fuse and the first pair gate contact of the first pair fuse to apply a common potential.

In some embodiments, the first active area and the first pair active area extend along a first direction and arranged on a straight line. A gap is present between the first active area and the first pair active area.

In some embodiments, the fuse array structure further includes a second pair active area, a second pair line contact and a second pair gate contact. The second pair line contact and the second pair gate contact are formed on the second pair active area. The pair common gate layer is formed across the first and second pair active areas. The pair common gate layer is between the second pair active area and the second pair gate contact. The second pair line contact, the second pair gate contact and the pair common gate layer form a second pair fuse. The second common connecting line is connected to the second pair line contact. The common connection structure covers and is connected to the first gate contact, the second gate contact, the first pair gate contact and the second pair gate contact.

In some embodiments, the first pair active area and the second pair active area extend along a first direction and are arranged in parallel in a second direction perpendicular to the first direction.

One aspect of the present disclosure is relative to a fuse array structure.

According to one embodiment of the present disclosure, a fuse array structure includes a first fuse and a second fuse. A first fuse includes a first transistor. A second fuse includes a second transistor. A gate of the first transistor and a gate of the second transistor form a common gate layer. Each of the first and second transistors has a floating source/drain terminal with a floating potential.

In one or more embodiments, each of the first and second transistors has a connecting source/drain terminal. The connecting source/drain terminal of the first transistor is applied with a first voltage. The connecting source/drain terminal of the second transistor is applied with a second voltage.

In some embodiments, the fuse array structure further includes a first pair fuse and a common connection structure. The first pair fuse includes a first pair transistor. The first pair transistor has a floating source/drain terminal with a floating potential and a connecting source/drain terminal applied with the first voltage. The common connection structure covers the gates of the first and second transistors and a gate of the first pair transistor to connect the gates of the first transistor, the second transistor and the first pair transistor to each other.

In some embodiments, the fuse array structure further includes a second pair fuse. The second pair fuse includes a second pair transistor. The second pair fuse has a gate, a floating source/drain terminal with a floating potential and a connecting source/drain terminal applied with the second voltage. The gates of the first and second pair transistors form a pair common gate layer.

In summary, fuses of a fuse array structure according to embodiments of the present disclosure may share a common gate layer, thereby reducing an overall occupied area.

It is to be understood that both the foregoing general description and the following detailed description are by examples, and are intended to provide further explanation of the disclosure as claimed.

BRIEF DESCRIPTION OF THE DRAWINGS

The advantages of the present disclosure are to be understood by the following exemplary embodiments and with reference to the attached drawings. The illustrations of the drawings are merely exemplary embodiments and are not to be considered as limiting the scope of the disclosure.

DETAILED DESCRIPTION

Figure 1:
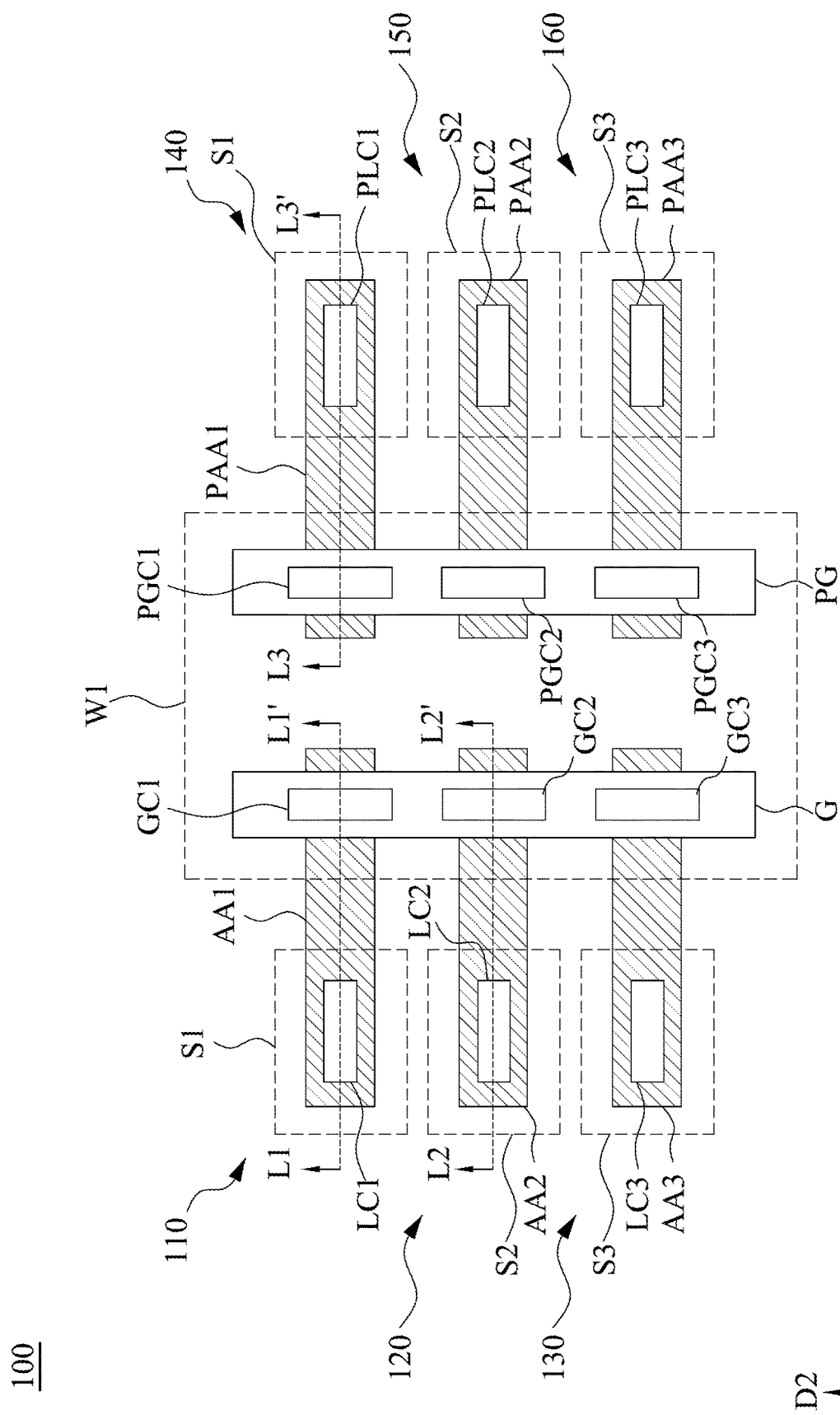
FIG. 1 illustrates a schematic top view of a fuse array structure according to one embodiment of the present disclosure.

Reference will now be made in detail to the embodiments of the present disclosure, examples of which are illustrated in the accompanying drawings. Wherever possible, the same reference numbers are used in the drawings and the description to refer to the same or like parts.

In addition, terms used in the specification and the claims generally have the usual meaning as used in the field, in the context of the disclosure and in the context of the particular content unless particularly specified. Some terms used to describe the disclosure are to be discussed below or elsewhere in the specification to provide additional guidance related to the description of the disclosure to specialists in the art.

The phrases "first," "second," etc., are solely used to separate the descriptions of elements or operations with the same technical terms, and are not intended to specify an order or to otherwise limit the disclosure.

Secondly, the phrases "comprising," "includes," "provided," and the like, used in the context are all open-ended terms, i.e., including but not limited to.

Further, in the context, "a" and "the" can generally refer to one or more unless the context particularly requires a certain number. It will be further understood that the phrases "comprising," "includes," "provided," and the like, used in the context indicate the characterization, region, integer, step, operation, element and/or component that is stated, and does not exclude descriptions that have been stated or additional one or more other characterizations, regions, integers, steps, operations, elements, components and/or groups thereof.

To reduce the area occupied by a fuse design on chip, embodiments of the present disclosure provide fuse array structures having a plurality of fuses sharing a common gate layer. A breakdown of dielectric of the shared common gate layer would be induced to form a conductive path permanently.

Reference is made in FIG. 1. FIG. 1 illustrates a schematic top view of a fuse array structure 100 according to one embodiment of the present disclosure. In some embodiments, the fuse array structure 100 is located within a substrate. To simplify matters, the substrate in which the fuse array structure 100 is located is not illustrated in FIG. 1.

Figure 2:
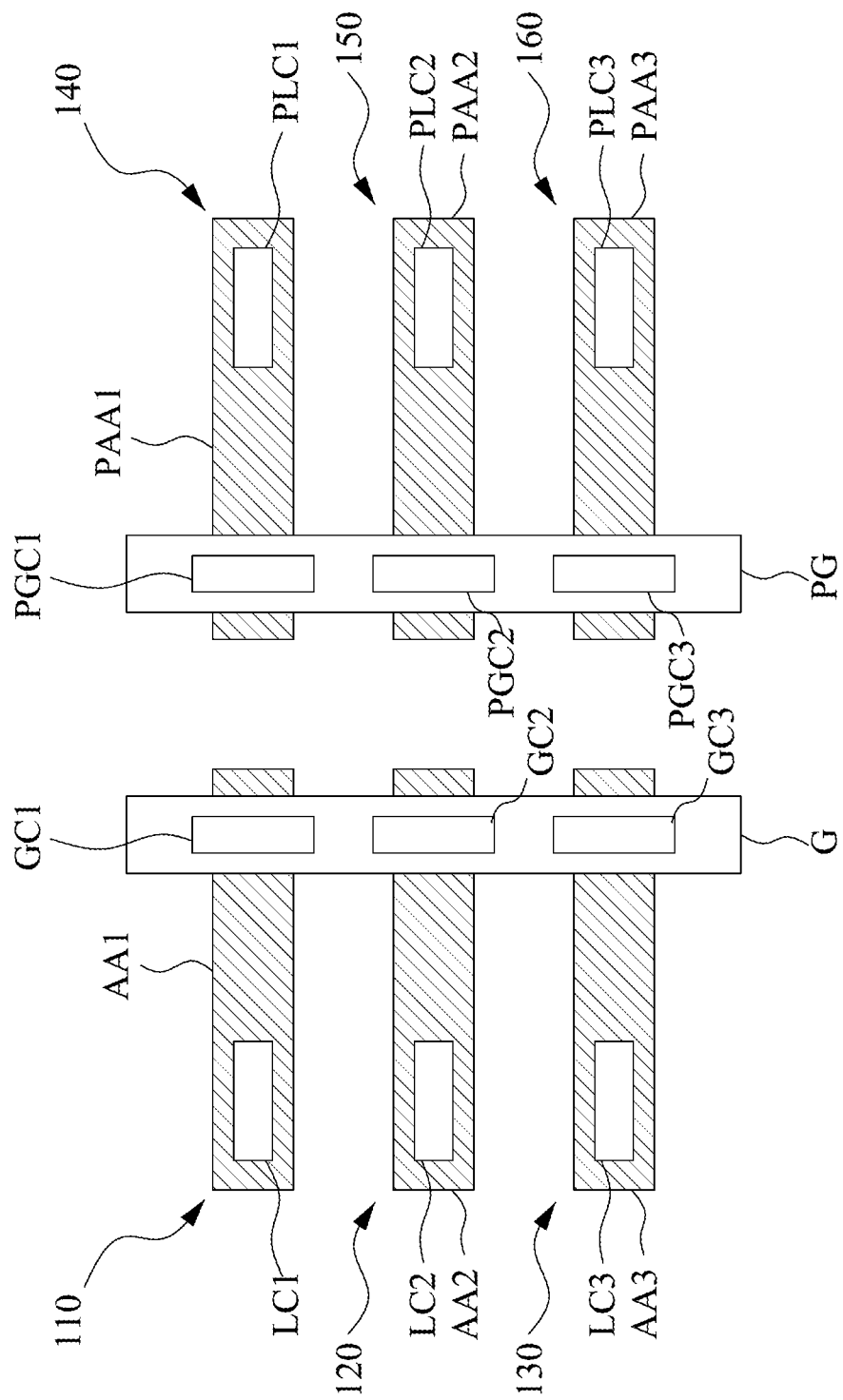
FIG. 2 illustrates a schematic top view of fuses according to one embodiment of the present disclosure.

As shown in FIG. 1, in this embodiment, the fuse array structure 100 includes fuses 110, 120 and 130. Symmetrically, the fuse array structure 100 includes pair fuses 140, 150 and 160 corresponding to the fuses 110, 120 and 130, respectively. Each of the fuses 110, 120 and 130 is formed by an active area, a line contact, a gate contact and a gate layer. In this embodiment, the fuses 110, 120 and 130 share the same common gate layer G, so that the area occupied by the gate can be reduced. Reference is made to both FIGS. 1 and 2. FIG. 2 illustrates a schematic top view of fuses according to one embodiment of the present disclosure. To simplify the drawing and the description to follow, a common connection structure W1 and common connecting lines S1, S2 and S3 are not shown in FIG. 2.

As shown in FIG. 2, the fuse 110 is formed by an active area AA1, a line contact LC1, a gate contact GC1 and the common gate layer G. The active area AA1 extends along a first direction. The line contact LC1 and the gate contact GC1 are formed on the active area AA1, and the line contact LC1 and the gate contact GC1 are located on two ends of the active area AA1. The common gate layer G extends along a second direction perpendicular to the first direction and across the active area AA1. The common gate layer G is located between the active area AA1 and the gate contact GC1.

In this embodiment, the active area AA1 is a semiconductor region with a conductive type. For example, the active area AA1 can be an n-doped region or a p-doped region. Therefore, the fuse 110 can be regard as a fuse with a transistor. The active area AA1 can be regard as a channel of the transistor. The line contact LC1 can be regarded as a connecting source/drain terminal. The common gate layer G and the gate contact GC1 are stacked on the active area AA1 in this order, so that the common gate layer G and the gate contact GC1 can be regard as the gate terminal of the transistor. Therefore, the fuse 110 equivalently has a transistor with a gate terminal, a source/drain terminal used for connection and another floating source/drain terminal.

In this embodiment of the present disclosure, each of the fuses equivalently includes only one transistor, thereby reducing an occupied area on a chip.

Referring back to FIG. 1, the line contact LC1 is connected to a common connecting line S1. The common connecting line S1 is used to apply a first voltage to the line contact LC1. In this embodiment, the common connecting line S1 covers the line contact LC1 and is shown as a dashed line in FIG. 1.

The fuse array structure 100 further includes a common connection structure W1. The gate contact GC1 of the fuse 110 is connected to the common connection structure W1. The common connection structure W1 is used to apply a common potential to the gate contact GC1.

For the fuse 110, the gate contact GC1 as the gate terminal is applied with the common potential, the line contact LC1 as the connecting source/drain terminal is applied with the first voltage, and the voltage difference between the line contact LC1 and the gate contact GC1 induces a current to flow through the active area AA1 between the line contact LC1 and the gate contact GC1. By adjusting the first voltage applied to the line contact LC1 and the common potential applied to the gate contact GC1, the current flowing through the active area AA1 can be adjusted. In some embodiments, the common potential applied by the gate contact GC1 can be a grounded potential. If the current flowing through the active area AA1 is increased to a breakdown value, a breakdown of the gate terminal formed by the gate contact GC1 and the common gate layer G would be induced irreversibly, so that a current path without gate controlling is formed in the fuse 110.

As mentioned above, in this embodiment, the common gate layer G is shared by the fuses 110, 120 and 130. The active areas AA1, AA2 and AA3 extend along the first direction D1, and the active areas AA1, AA2 and AA3 are arranged in parallel in the second direction D2 perpendicular to the first direction D1. The common gate layer G extends across the active areas AA1, AA2 and AA3. The fuses 120 and 130 have structures similar to the fuse 110. As shown in FIG. 2, the fuse 120 is formed by an active area AA2, a line contact LC2 and a gate contact GC2 formed on the active area AA2, and the common gate layer G is located between the active area AA2 and the gate contact CG2. The fuse 130 is formed by an active area AA3, a line contact LC3 and a gate contact GC3 formed on the active area AA3, and the common gate layer G is located between the active area AA3 and the gate contact CG3.

For each of the fuses 110, 120 and 130, the line contacts LC1, LC2 and LC3 can be connected to different voltages. Reference is made back to FIG. 1. The line contact LC2 is connected to the common connecting line S2 to be applied with a second voltage, and the line contact LC3 is connected the common connecting line S3 to be applied with a third voltage. Accordingly, many fuses can share the same common gate layer, thereby reducing the occupied area on a chip. By adjusting voltages (e.g., the first voltage applied by connecting line S1, the second voltage applied by connecting line S2 or the third voltage applied by connecting line S3) to different line contacts, breakdowns of the fuses can be induced, and a plurality of current paths are formed within the corresponding fuses, respectively and permanently.

In FIGS. 1 and 2, the fuse array structure 110 further includes the pair fuses 140, 150 and 160. The pair fuses 140, 150 and 160 have structures similar to the fuse 110.

For example, the pair fuse 140 is spatially symmetric with the fuse 110. The pair fuse 140 is formed by a pair active area PAA1, a pair line contact PLC1, a pair gate contact PGC1 and a pair common gate layer PG. The pair active area PAA1 extends along the first direction. The pair line contact PLC1 and the pair gate contact PGC1 are formed over the pair active area PAA1. The pair common gate layer PG is formed on the pair active area PAA1 and extends along the second direction.

The first active area AA1 and the first pair active area PAA1 extend along the first direction D1 and arranged on a straight line. A gap is present between the active area AA1 of the fuse 110 and the pair active area PAA1 of the pair fuse 140. On the pair active area PAA1 of the pair fuse 140, the pair gate contact PGC1 is located on one end adjacent the active area AA1 of the fuse 110. Therefore, the pair gate contact PGC1 may also be covered by the common connection structure W1 to have the same common potential. On the pair active area PAA1 of the pair fuse 140, the pair line contact PLC1 is located on another end distanced from the active area AA1 of the fuse 110. As shown in FIG. 1, the pair line contact PLC1 is also connected to the common connecting line S1 to be applied with the first voltage.

The pair fuse 140 can be regarded as a backup of the fuse 110. In some embodiments, the fuse 110 and the pair fuse 140 are connected to the same device through the common connecting line S1, and the device can apply the first voltage to the common connecting line S1. Once users want to produce a current path always conductive for the device, the users can control the device to enlarge the first voltage to a breakdown value, so that a breakdown of at least one of the fuse 110 and the pair fuse 140 can be induced.

Similarly, the pair fuse 150 can be regarded as a backup of the fuse 120, and the pair fuse 160 can be regarded as a backup of the fuse 130.

The pair fuse 150 is formed by a pair active area PAA2, a pair line contact PLC2, a pair gate contact PGC2 and a pair common gate layer PG. The pair active area PAA2 extends along the first direction. The pair line contact PLC2 and the pair gate contact PGC2 are formed over the pair active area PAA2. The pair line contact PLC2 is connected to the common connecting line S2.

The pair fuse 160 is formed by a pair active area PAA3, a pair line contact PLC3, a pair gate contact PGC3 and a pair common gate layer PG. The pair active area PAA3 extends along the first direction. The pair line contact PLC3 and the pair gate contact PGC3 are formed over the pair active area PAA3. The pair line contact PLC3 is connected to the common connecting line S3.

As shown in FIGS. 1 and 2, the pair active areas PAA1, PAA2 and PAA3 extend along the first direction D1 and are arranged in parallel in the second direction D1.

Figure 3:
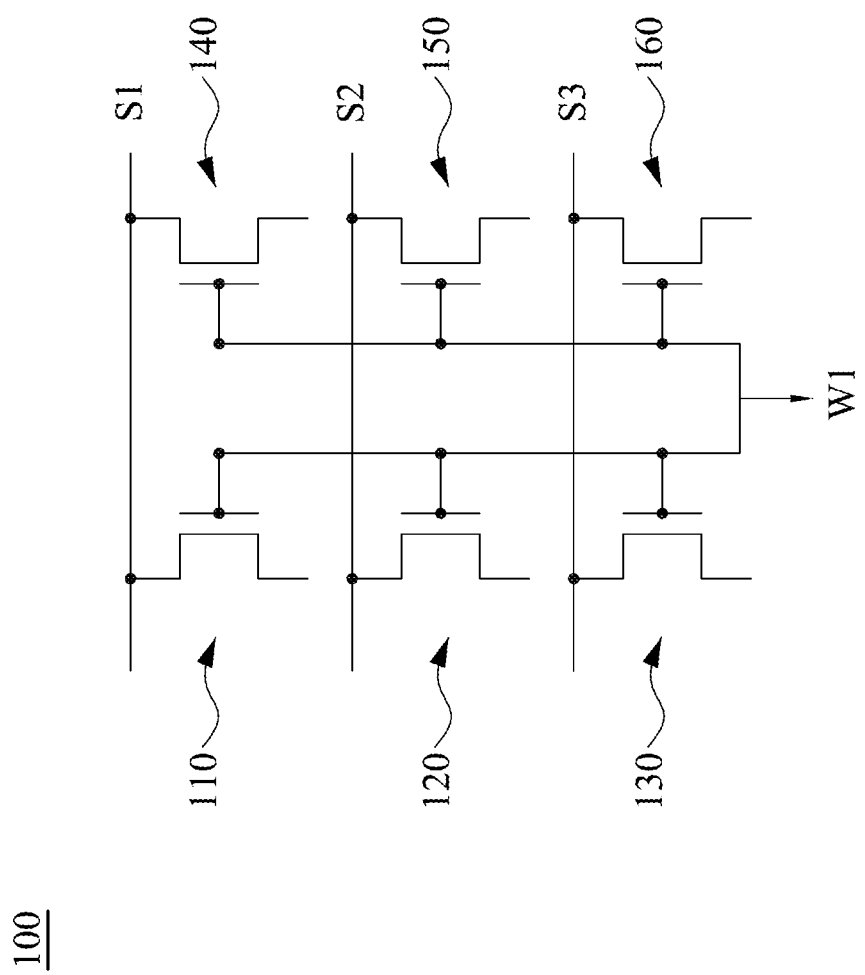
FIG. 3 illustrates a schematic circuit of a fuse array structure according to one embodiment of the present disclosure.

Reference is made to FIGS. 1 and 3. FIG. 3 illustrates a schematic circuit of the fuse array structure 100 of FIG. 1 according to one embodiment of the present disclosure.

As mentioned above, the fuse array 100 includes the fuses 110, 120 and 130 and the corresponding pair fuses 140, 150 and 160. The fuses 110, 120 and 130 share the same common gate layer G, so that the gate terminals of the fuses 110, 120 and 130 are connected to each other. The gate terminals of the pair fuses 140, 150 and 160 are connected to each other, similarly. All of the gate terminals of the fuses 110, 120 and 130 and the pair fuses 140, 150 and 160 are connected to the common connection structure W1 to be applied with the same common potential.

A connecting source/drain terminal of the fuse 110 and a connecting source/drain terminal of the pair fuse 140 are connected to the same common connecting line S1, so that the pair fuse 140 can be regarded as a backup of the fuse 110. Another source/drain terminal of the fuse 110 and another connecting source/drain terminal of the pair fuse 140 are floating.

Similarly, each of the fuse 120 and the pair fuse 150 has a gate terminal connected to the common connection structure W1, a connecting source/drain terminal connected to the common connecting line S2 and another floating source/drain terminal. Each of the fuse 130 and the pair fuse 160 has a gate terminal connected to the common connection structure W1, a connecting source/drain terminal connected to the common connecting line S3 and another floating source/drain terminal.

Figure 4:
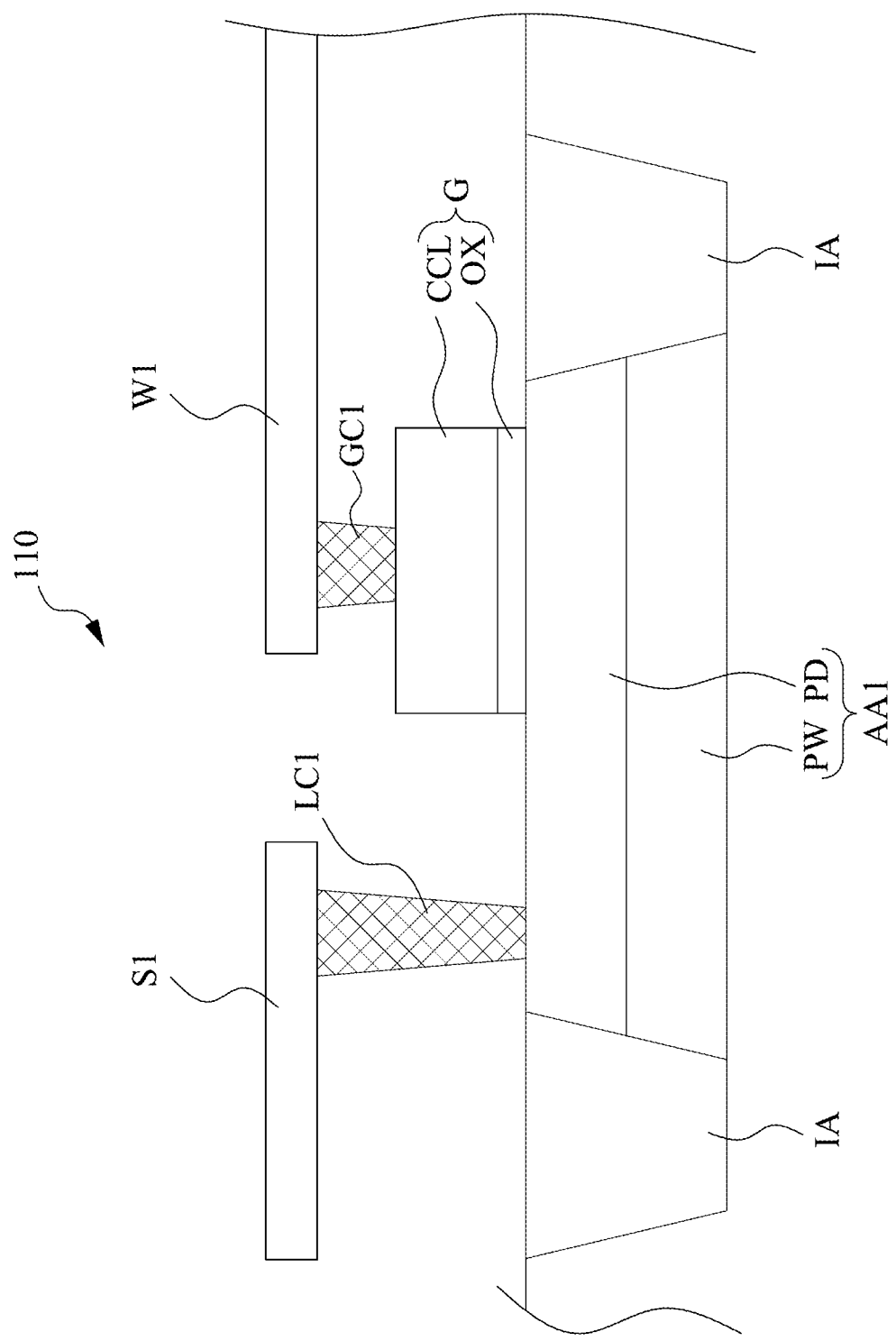
FIGS. 4-6 illustrate cross-sectional views of fuses according to one embodiment of the present disclosure.
Figure 5:
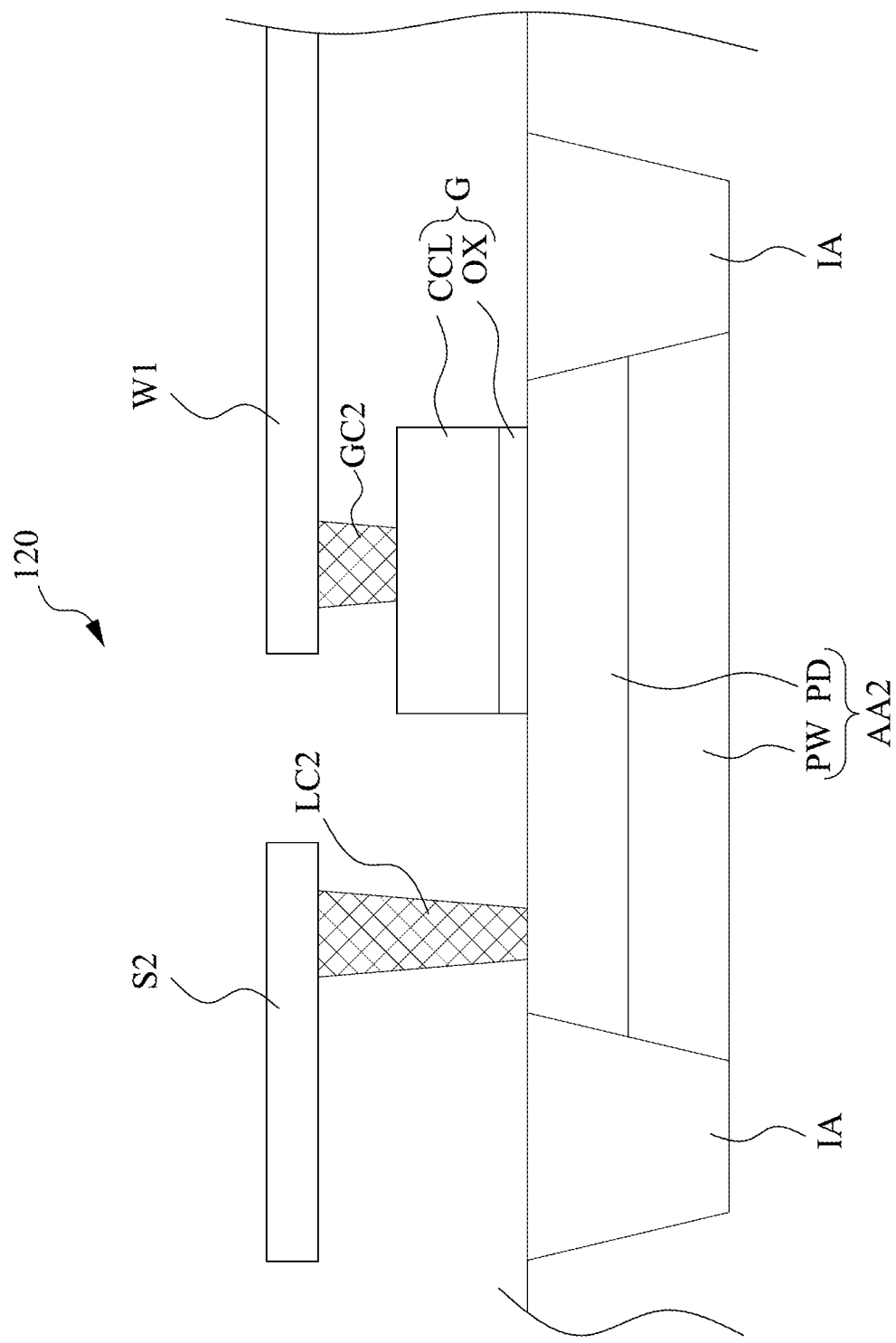
Figure 6:
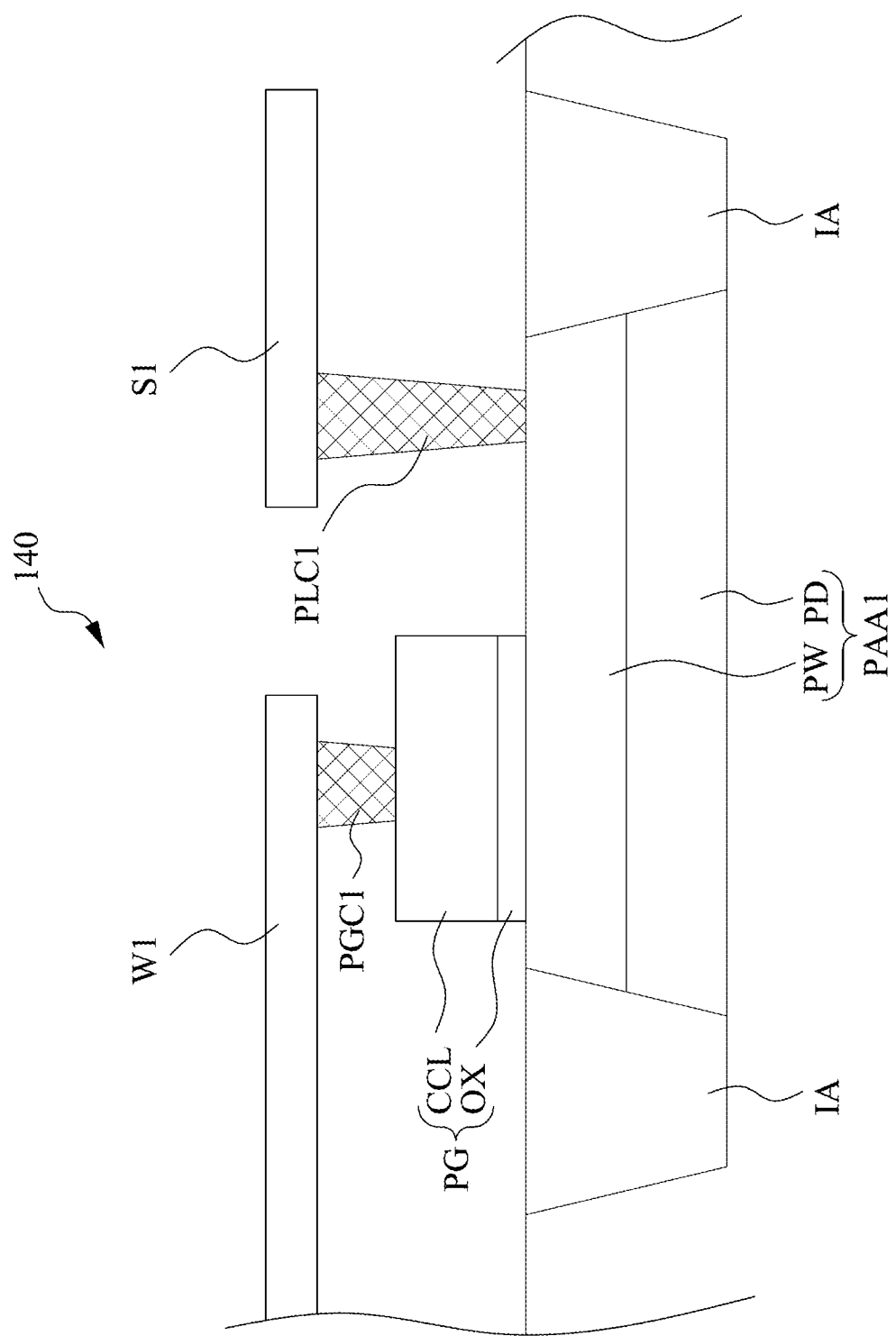

FIGS. 4-6 illustrate cross-sectional views of fuses according to one embodiment of the present disclosure. The cross-sectional view in FIG. 4 is along line L1-L1' in FIG. 1. The cross-sectional view in FIG. 5 is along line L2-L2' in FIG. 1. The cross-sectional view in FIG. 6 is along line L3-L3' in FIG. 1.

In FIG. 4, the fuse 110 is formed on a semiconductor substrate.

As shown in FIG. 4, in this embodiment, the fuse 110 includes the active area AA1, the line contact LC1, the gate contact GC1 and the common gate layer G. The line contact LC1 and the gate contact GC1 are formed on the active area AA1. The common gate layer is located between the active area AA1 and the gate contact GC1.

In FIG. 4, an isolation area IA surrounds the active area AA1 to isolate the fuse 110 from other fuses of the array structure. In some embodiments, each of the active areas of the fuse and the pair fuse is surrounded by an isolation area IA to be isolated from other fuses of the array structure.

In this embodiment, the active area AA1 includes a semiconductor well PW and a semiconductor doped region PD. The semiconductor doped region PD is formed within the semiconductor well PW. The semiconductor well PW has a first conductive type, and the semiconductor doped region PD has a second conductive type different from the first conductive type. For example, the semiconductor well PW is a P-doped semiconductor, and the semiconductor doped region PD is an N$^+$ semiconductor region. In some embodiments, the semiconductor doped region PD is doped from a top portion of the semiconductor well PW.

As shown in FIG. 4, in this embodiment, the common gate layer G includes a common conductive layer CCL and an oxide layer OX under the common conductive layer CCL. The common conductive layer CCL extends across the active area AA1. In this embodiment, the common conductive layer CCL extends across the active areas AA1, AA2 and AA3 as shown in FIG. 1. In some embodiments, a material of the common conductive layer CCL includes ploy material.

The line contact LC1 is connected to the common connecting line S1, and the gate contact GC1 is connected to the common connection structure W1. As shown in FIG. 4, the line contact LC1 is covered by the common connecting line S1, and the gate contact GC1 is covered by the common connection structure W1. As mentioned above, the common connecting line S1 can be used to apply a first voltage and the common connection structure W1 can be used to apply a common potential. If the difference between the first voltage and the common potential is greater than a breakdown value, a breakdown of the oxide layer OX, which is a dielectric of the common gate layer, would be induced, thereby creating an electrically conductive path locally and irreversibly.

Similar to the fuse 110 shown in FIG. 4, a cross-section view of the fuse 120 is illustrated in FIG. 5. As shown in FIG. 5, the fuse 120 is formed by the active area AA2, the line contact LC2, the gate contact GC2 and the common gate layer G. The fuses 110 and 120 share the same common gate layer G. The active area AA2 includes the common conductive layer CGL and the oxide layer OX, which is dielectric of the common gate layer G.

The line contact LC2 is connected to the common connecting line S2. Therefore, the fuse 120 is independent form the fuse 110, and a breakdown of the fuse 120 can induced based on the voltage difference between the common potential applied by the common connection structure W1 and the second voltage applied by the common connecting line S2.

Reference is made in FIG. 6. FIG. 6 illustrates a cross-section view of the pair fuse 140 corresponding to the fuse 110. In this embodiment, the structure of the pair fuse 140 is symmetric with the fuse 110. The pair fuse 140 is formed by the pair active area PAA1, the pair line contact PLC1, the pair gate contact PGC1 and the pair common gate layer PG. Since the pair fuse 140 can be regarded as the backup of the fuse 110, the pair line contact PLC1 is connected to the common connecting line S1, which is connected to the line contact LC1 at the same time. Therefore, even if the breakdown of the fuse 110 fails, a conductive path can still be formed in the pair fuse 140 according to the inducing local breakdown of the pair common gate layer G. The pair common gate layer PG includes another common conductive layer CCL and another oxide layer OX, which is dielectric of the pair common gate layer PG.

In summary, fuses of a fuse array structure according to embodiments of the present disclosure may share a common gate layer, thereby reducing an overall occupied area. It is helpful that the fuse pattern can be shrunk with layout design.

Although the embodiments of the present disclosure have been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the embodiments of the present disclosure without departing from the scope or spirit of the present disclosure. In view of the foregoing, it is intended that the present disclosure cover modifications and variations of this invention provided they fall within the scope of the following claims.

What is claimed is:

1. A fuse array structure, comprising:
   a first active area and a second active area;
   a common gate layer formed across the first and second active areas;
   a first line contact and a first gate contact formed on the first active area, wherein the common gate layer is between the first active area and the first gate contact, the first line contact is connected to a first common connecting line applied with a first voltage, and the first active area, the first line contact, the first gate contact and the common gate layer form a first fuse; and
   a second line contact and a second gate contact formed on the second active area, wherein the second line contact is connected to a second common connecting line applied with a second voltage, and the second active area, the second line contact, the second gate contact and the common gate layer form a second fuse.

2. The fuse array structure of claim 1, wherein the common gate layer further comprises:
   a common conductive layer formed across the first and second active area; and
   an oxide layer formed under the common conductive layer.

3. The fuse array structure of claim 1, wherein each of the first and second active areas comprises:
   a semiconductor well with a first conductive type; and
   a semiconductor doped region formed within the semiconductor well and with a second conductive type different from the first conductive type, wherein the semiconductor doped region is in contact with the common gate layer.

4. The fuse array structure of claim 1, wherein each of the first and second active areas is surrounded by an isolation area.

5. The fuse array structure of claim 1, wherein the first and second active areas extend along a first direction and are arranged in parallel in a second direction perpendicular to the first direction, and the common gate layer extends along the second direction.

6. The fuse array structure of claim 1, further comprising:
   a common connection structure connected to the first and second gate contacts and applied with a common potential.

7. The fuse array structure of claim 6, wherein the common connection structure extends along a direction in which the common gate layer extends, so that all of the first and second gate contacts are covered by the common connection structure.

8. The fuse array structure of claim 1, further comprising:
a first pair active area;
a pair common gate layer formed on the first pair active area;
a first pair line contact and a first pair gate contact formed on the first pair active area, wherein the pair common gate layer is between the first pair active area and the first pair gate contact, the first pair line contact is connected to the first common connecting line, and the first pair active area, the first pair line contact, the first pair gate contact and the pair common gate layer form a first pair fuse; and
a common connection structure connected to the first gate contact of the first fuse and the first pair gate contact of the first pair fuse to apply a common potential.

9. The fuse array structure of claim 8, wherein the first active area and the first pair active area extend along a first direction and are arranged on a straight line, and a gap is present between the first active area and the first pair active area.

10. The fuse array structure of claim 8, further comprising:
a second pair active area;
a second pair line contact and a second pair gate contact formed on the second pair active area, wherein the pair common gate layer is formed across the first and second pair active areas, the pair common gate layer is between the second pair active area and the second pair gate contact, the second pair line contact, the second pair gate contact and the pair common gate layer form a second pair fuse, and the second common connecting line is connected to the second pair line contact, wherein the common connection structure covers and is connected to the first gate contact, the second gate contact, the first pair gate contact and the second pair gate contact.

11. The fuse array structure of claim 10, wherein the first pair active area and the second pair active area extend along a first direction and are arranged in parallel in a second direction perpendicular to the first direction.

12. A fuse array structure, comprising:
a first fuse comprising a first transistor;
a second fuse comprising a second transistor, wherein a gate of the first transistor and a gate of the second transistor form a common gate layer, and each of the first and second transistors has a floating source/drain terminal with a floating potential, wherein each of the first and second transistors has a connecting source/drain terminal, the connecting source/drain terminal of the first transistor is applied with a first voltage, and the connecting source/drain terminal of the second transistor is applied with a second voltage;
a first pair fuse comprising a first pair transistor, wherein the first pair transistor has a floating source/drain terminal with a floating potential and a connecting source/drain terminal applied with the first voltage; and
a common connection structure covering the gates of the first and second transistors and a gate of the first pair transistor to connect the gates of the first transistor, the second transistor and the first pair transistor to each other.

13. The fuse array structure of claim 12, further comprising:
a second pair fuse comprising a second pair transistor, wherein the second pair fuse has a gate, a floating source/drain terminal with a floating potential and a connecting source/drain terminal applied with the second voltage, and the gates of the first and second pair transistors form a pair common gate layer.

* * * * *